United States Patent
Dangler et al.

(10) Patent No.: US 9,873,132 B2
(45) Date of Patent: Jan. 23, 2018

(54) DIGITAL PROCESSING EQUIPMENT

(71) Applicant: LENOVO Enterprise Solutions (Singapore) PTE. LTD., New Tech Park (SG)

(72) Inventors: John Dangler, Rochester, MN (US); Brian L. Carlson, Rochester, MN (US); Roger Krabbenhoft, Rochester, MN (US); Kevin A. Splittstoesser, Rochester, MN (US); Jeffrey A. Taylor, Morrisville, NC (US)

(73) Assignee: LENOVO ENTERPRISE SOLUTIONS (SINGAPORE) PTE. LTD., New Tech Park (SG)

( * ) Notice: Subject to any disclaimer, the term of this patent is extended or adjusted under 35 U.S.C. 154(b) by 69 days.

(21) Appl. No.: 14/730,404

(22) Filed: Jun. 4, 2015

(65) Prior Publication Data
US 2016/0358830 A1 Dec. 8, 2016

(51) Int. Cl.
| | | |
|---|---|---|
| B05C 11/00 | (2006.01) |
| B05B 12/12 | (2006.01) |
| B05B 12/04 | (2006.01) |
| B05C 11/10 | (2006.01) |
| B05B 12/14 | (2006.01) |
| B05B 15/04 | (2006.01) |
| H01L 21/67 | (2006.01) |
| H01L 21/677 | (2006.01) |
| B05B 13/02 | (2006.01) |

(52) U.S. Cl.
CPC ............ *B05B 12/122* (2013.01); *B05B 12/04* (2013.01); *B05B 12/1409* (2013.01); *B05B 15/0406* (2013.01); *B05C 11/1036* (2013.01); *H01L 21/6708* (2013.01); *H01L 21/6776* (2013.01); *H01L 21/67253* (2013.01); *H01L 21/67259* (2013.01); *B05B 13/0221* (2013.01)

(58) Field of Classification Search
CPC .. B05B 15/00; B05B 1/14; B05B 7/06; B05B 7/063; B05B 7/064; B05C 11/1036
USPC ........ 118/313–315, 323, 305, 324, 663, 665, 118/686, 679–681, 695–698; 347/9, 12, 347/19, 22, 30
See application file for complete search history.

(56) References Cited

U.S. PATENT DOCUMENTS

| | | |
|---|---|---|
| 3,298,588 A | 1/1967 | Shomhe |
| 5,294,459 A | 3/1994 | Hogan et al. |

(Continued)

*Primary Examiner* — Yewebdar Tadesse
(74) *Attorney, Agent, or Firm* — Kunzler, PC.

(57) ABSTRACT

An apparatus includes a spray module with at least one column of spray nozzles. Each spray nozzle is configured to deliver a processing substance on a semiconductor substrate during a process for semiconductor manufacturing as the semiconductor substrate moves past the spray module. The at least one column of spray nozzles is arranged with respect to a direction of travel of the semiconductor substrate so the semiconductor substrate passes the spray nozzles. A location module identifies a location of the semiconductor substrate with respect to the spray module. A spray pattern module determines a spray pattern of where a processing substance is to be delivered to the semiconductor substrate and a nozzle control module actuates each spray nozzle independently based on the spray pattern and a location of the semiconductor identified by the location module.

11 Claims, 6 Drawing Sheets

(56) References Cited

U.S. PATENT DOCUMENTS

| | | | |
|---|---|---|---|
| 5,683,752 A * | 11/1997 | Popp | A61F 13/15699 118/668 |
| 6,585,865 B2 | 7/2003 | Acciai et al. | |
| 6,596,384 B1 | 7/2003 | Day et al. | |
| 7,026,124 B2 | 4/2006 | Barth et al. | |
| 2002/0130918 A1 * | 9/2002 | Hayakawa | B41J 2/16508 347/29 |
| 2004/0023567 A1 * | 2/2004 | Koyama | B41J 2/04503 439/894 |
| 2004/0056915 A1 * | 3/2004 | Miyazawa | B41J 2/16579 347/19 |
| 2007/0281388 A1 | 12/2007 | Yu et al. | |

* cited by examiner

DIGITAL PROCESSING EQUIPMENT

BACKGROUND

Field

The subject matter disclosed herein relates to semiconductor processing and more particularly relates to digital processing equipment for customizable delivery of processing substances to a semiconductor substrate.

Description of the Related Art

Equipment that is used for processing cores or external layers for semiconductor substrates, such as printed circuit boards or flex cables, typically process the entire surface area of a core or external layer uniformly. However, there are situations where it is preferential to process a portion of the core or external layer under a different condition, or not process a portion at all.

BRIEF SUMMARY

An apparatus for selective semiconductor processing is disclosed. A method and system also perform the functions of the apparatus. The apparatus may include a spray module having at least one column of spray nozzles and a location module that identifies a location of the semiconductor substrate with respect to the spray module. The spray module delivers a processing substance to the semiconductor substrate. The apparatus, in some embodiments, includes a spray pattern module that determines a spray pattern of where a processing substance is to be delivered to the semiconductor substrate, and a nozzle control module that actuates each spray nozzle independently based on the spray pattern and a location of the semiconductor identified by the location module. The nozzle control module controls each spray nozzle independently where one spray nozzle of the column of spray nozzles positioned over the semiconductor substrate may be delivering a processing substance while an adjacent spray nozzle of the column of spray nozzles positioned over the semiconductor substrate may be off or may be delivering a different processing substance. Each spray nozzle may be configured to deliver a processing substance on a semiconductor substrate during a process for semiconductor manufacturing as the semiconductor substrate moves past the spray module, where the column of spray nozzles is arranged with respect to a direction of travel of the semiconductor substrate so the semiconductor substrate passes the spray nozzles.

In certain embodiments, the nozzle control module selectively turns on and off each spray nozzle in response to the location of the semiconductor substrate passing under the spray module. In some embodiments, the apparatus may also include a substance module that determines an amount of processing substance to be applied to the semiconductor substrate at a particular location on the semiconductor substrate where the nozzle control module turns on an amount of columns of spray nozzles to deliver the determined amount of processing substance to the particular location.

In certain embodiments, the spray module delivers a plurality of processing substances to the semiconductor substrate. Each processing substance has a processing substance type, and the spray pattern module also includes a substance module that determines a type and amount of processing substance to be delivered to a particular location on the semiconductor substrate. In some embodiments, plurality of processing substances may include an etching substance, a masking substance, a deposit substance, a curing substance, a rinse, a drain, and a vacuum.

Further, each spray nozzle may deliver one of the plurality of processing substances to the semiconductor substrate, where the nozzle control module adjusts a spray nozzle based on the determined processing substance type and turns the spray nozzle on and off based on the amount of processing substance to be delivered to the semiconductor substrate. Alternatively, each nozzle may deliver one of the plurality of processing substances for a first part of a pass of the semiconductor substrate and to switch to another of the plurality of processing substances for a second part of the pass.

In one embodiment, the spray module may include a plurality of columns of spray nozzles, where the nozzle control module controls each spray nozzle in a column of spray nozzles independently. In the embodiment, a spray nozzle of one column of spray nozzles may be delivering a processing substance while an adjacent spray nozzle in an adjacent column of spray nozzles may be off.

In certain embodiments, one column of spray nozzles is configured to spray the processing substance and another column of spray nozzles is configured to deliver a vacuum to the semiconductor substrate. In certain embodiments, each column of spray nozzles is configured to spray a different processing substance from a plurality of processing substance types onto the semiconductor substrate.

The method includes identifying a location of a semiconductor substrate with respect to a spray module. The spray module includes at least one column of spray nozzles and each spray nozzle configured to deliver a processing substance to the semiconductor substrate during a process for semiconductor manufacturing as the semiconductor substrate moves past the spray module. The at least one column of spray nozzles is arranged with respect to a direction of travel of the semiconductor substrate so the semiconductor substrate passes the spray nozzles. The method may include determining a spray pattern of where the processing substance is to be applied to the semiconductor substrate, and actuate each spray nozzle independently based on the spray pattern and the identified location of the semiconductor substrate. In one embodiment, one spray nozzle of the column of spray nozzles positioned over the semiconductor substrate may be delivering a processing substance while an adjacent spray nozzle of the column of spray nozzles positioned over the semiconductor substrate may be off or may be delivering a different processing substance.

In some embodiments, the method may include identifying a location of the processing substance to be applied to the semiconductor substrate based on the spray pattern, and calculating a spray duration based on the identified location where the processing substance is to be applied. Selectively activating each spray nozzle based on the spray pattern includes activating each spray nozzle for the calculated spray duration. In some embodiments, the method may include calculating a spray time based on the identified location of the semiconductor substrate with respect to the spray module and the spray pattern, where selectively activating each spray nozzle based on the spray pattern includes activating each spray nozzle at the calculated spray time.

In certain embodiments, the processing substance is one of a plurality of processing substances, and the method further includes identifying a particular processing substance to be applied to the semiconductor substrate based on the spray pattern, where selectively activating each spray nozzle based on the spray pattern includes delivering the particular processing substance to the semiconductor substrate based on the spray pattern.

In certain embodiments, the spray module comprises a plurality of columns of spray nozzles. In the embodiments, the method also includes identifying an amount of processing substance to be applied to the semiconductor substrate at a particular location based on the spray pattern and calculating a number of spray nozzles needed to achieve the amount of processing substance to be applied at the particular location, where selectively activating each spray nozzle based on the spray pattern includes activating the number of adjacent spray nozzles in adjacent columns of spray nozzles.

In certain embodiments, determining a spray pattern includes receiving an image of a layer of a semiconductor product and identifying, from the image, areas of the semiconductor substrate needing the processing substance during semiconductor manufacturing. In some embodiments, the method includes receiving inspection data that includes inspection results of a semiconductor manufactured using the spray pattern and adjusting the spray pattern based on the inspection data.

The system includes a spray head with at least one spray column. The spray column includes a plurality of spray nozzles, where each spray nozzle is configured to deliver a processing substance onto a semiconductor substrate during a process for semiconductor manufacturing. The system includes a conveyor that moves the semiconductor substrate past the spray head, where the at least one spray column is arranged with respect to a direction of travel of the semiconductor substrate so the semiconductor substrate passes the spray nozzles, and a spray controller. The spray controller, in various embodiments includes a location module that identifies a location of the semiconductor substrate with respect to the spray head, a spray pattern module that determines a spray pattern of where the processing substance is to be delivered to the semiconductor substrate, and a nozzle control module that actuates each spray nozzle independently based on the spray pattern. In one embodiment, the nozzle control module controls each spray nozzle independently such that one spray nozzle of the column of spray nozzles positioned over the semiconductor substrate may be delivering a processing substance while an adjacent spray nozzle of the column of spray nozzles positioned over the semiconductor substrate may be off or may be delivering a different processing substance.

In certain embodiments, the conveyor includes at least one conveyor belt, where the semiconductor substrate is resting atop the conveyor belt. The spray head is fixed with respect to the conveyor belt, and the conveyor belt is moving the semiconductor substrate past the spray head. In certain embodiments, the spray head also includes a drain column located adjacent to each spray column, where the drain column includes a plurality of drain nozzles configured to remove the processing substance from the semiconductor substrate.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
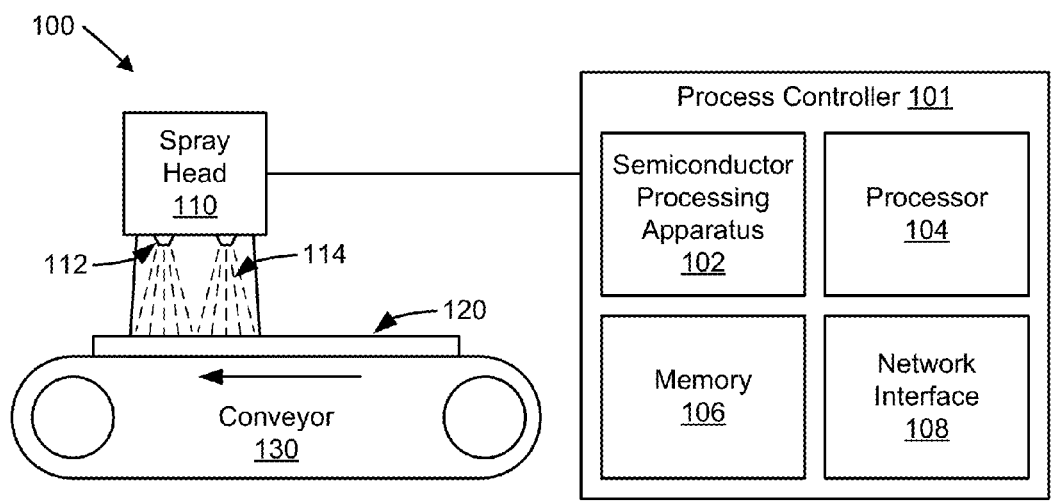
FIG. 1 is a schematic block diagram illustrating one embodiment of a system for selective semiconductor processing.

As will be appreciated by one skilled in the art, aspects of the embodiments may be embodied as a system, method, or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods, and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Generally, the disclosed systems, apparatuses, and methods allow for customizable delivery of processing substances to a semiconductor substrate. As a semiconductor panel moves past a plurality of spray nozzles in a y-axis direction, the spray nozzles may selectively deliver processing chemistry along the x direction, as dictated by various inputs. The processing chemistry may be delivered, as dictated, anywhere along the surface area of the panel, (e.g., selective etch, selective oxide, selective metallization). Through customizable delivery of chemistry across each section (and each side) of a panel, semiconductor processing may be optimized.

In some embodiments, the systems and/or apparatuses may include a process head having individually programmable nozzles to control delivery and flow along the width of the conveyor. A spray pattern (e.g., a processing map) is creating using inputs such as: Gerber data, inspection data, manufacturing data, and/or historical data. From these inputs, the disclosed systems, apparatuses, and methods determine areas of a panel that entail preferential processing. Next, the panel may be sectioned, identifying discrete areas and specific processing for each areas. From the specific processing for each area, processing instructions are generated for controlling the individually programmable nozzles. The processing instructions are implemented as the semiconductor substrate moves past the programmable nozzles, so as to selectively process different areas of the semiconductor substrate.

For example, the spray patterns may be for: selective surface treatment including oxides, selective plating (for example electroless nickel immersion gold ("ENIG")), etch and/or rework in high density areas/fine line areas, and/or etch/rework for etch equipment failures (e.g., plugged nozzles). In some embodiments, the customizable delivery of processing substances may reduce or eliminate photoresist processes (e.g., micro-etching, cleaning, applying photoresist, lamination, exposure, developing, stripping the photoresist, and the like). Customizable delivery of processing substances may further minimize or eliminate damage to surface finish and lead to optimized solder mask development (e.g., high density surface mounting device ("SMT") vs. plating through holes ("PTH") areas), selective high pressure rinsing or hole cleaning, etc.

In some embodiments, one or more of the individually programmable nozzles may be configured to rinse, drain, and/or remove (e.g., via vacuum) processing substances so as to prevent the process chemistry from migrating to areas of the printed circuit board ("PCB") or other semiconductor product that do not require that particular chemical process. Beneficially, the disclosed systems, apparatuses, and methods result in improved product performance, including increased manufacturability/process capability and increased quality/reliability. Further advantages the disclosed systems, apparatuses, and methods include: cost savings through reduction in materials used (e.g., elimination of resist), reduced process steps, reduced manufacturing times, etc.

FIG. 1 depicts a schematic block diagram illustrating a system 100 for selective semiconductor processing, according to embodiments of the disclosure. The system 100 includes, in one embodiment, a process controller 101 that includes a semiconductor processing apparatus 102, a processor 104, a memory 106, and a network interface 108. The system 100 further includes a spray head 110, at least one semiconductor substrate 120, and a conveyor 130. Other embodiments may include multiple spray heads 110. The process controller 101 is connectively coupled to and controls the spray head 110; in some embodiments, the process controller 101 is also connectively coupled to and controls the conveyor 130. The conveyor 130 is a conveyor system for transporting the semiconductor substrate 120 and may include any device capable of transporting the semiconductor substrate 120 past the spray head 110. In some embodiments, the conveyor 130 may include a belt conveyor, a chain conveyor, a set of rollers, or other conveying mechanism.

The semiconductor processing apparatus 102, in one embodiment, is configured to identify a location of the semiconductor substrate 120 with respect to the spray head 110, determine a spray pattern of where a processing substance 114 is to be delivered to the semiconductor substrate 120, and to selectively turn on and off each spray nozzle 112 of the spray head 110 based on the spray pattern. In some embodiments, the semiconductor processing apparatus 102 actuates each spray nozzle 112 in response to the identified location of the semiconductor substrate 120 passing underneath the spray nozzle 112.

In some embodiments, the semiconductor processing apparatus 102 may be integrated with or form a part of the spray head 110. The semiconductor processing apparatus 102 include computer hardware, computer software, or a combination of both computer hardware and computer software. For example, the semiconductor processing apparatus 102 may include circuitry, or a processor, configured to receive a sensor inputs and deliver instructions to the spray head 110. As another example, the semiconductor processing apparatus 102 may include computer program code that allows the processor 104 to identify a spray pattern. The semiconductor processing apparatus 102 is discussed in further detail with reference to FIG. 2, below.

The processor 104, in one embodiment, may include any known controller capable of executing computer-readable instructions and/or capable of performing logical operations. For example, the processor 104 may be a microcontroller, a microprocessor, a central processing unit ("CPU"), a graphics processing unit ("GPU"), an auxiliary processing unit, a field programmable gate array ("FPGA"), or similar programmable controller. In some embodiments, the processor 104 executes instructions stored in the memory 106 to perform the methods and routines described herein. The processor 104, in one embodiment, is communicatively coupled to the semiconductor processing apparatus 102, the memory 106, and the network interface 108.

The memory 106, in one embodiment, is a computer readable storage medium. In some embodiments, the memory 106 includes volatile computer storage media. For example, the memory 106 may include a random access memory ("RAM"), including dynamic RAM ("DRAM"), synchronous dynamic RAM ("SDRAM"), and/or static RAM ("SRAM"). In some embodiments, the memory 106 includes non-volatile computer storage media. For example, the memory 106 may include a hard disk drive, a flash memory, or any other suitable non-volatile computer storage device. In some embodiments, the memory 106 includes both volatile and non-volatile computer storage media.

In some embodiments, the memory 106 stores data relating to selectively delivering a processing substance to a semiconductor substrate 120. For example, the memory 106 may store manufacturing data, Gerber data, inspection data, spray patterns, spray delivery times, and the like. In some embodiments, the memory 106 also stores program code and related data, such as an operating system or other controller algorithms operating on the process controller 101.

The network interface 108, in one embodiment, includes software and/or hardware connecting the process controller 101 to the spray head 110. In some embodiments, the network interface 108 may also connect the process controller 101 to the conveyor 130. For example, the network interface 108 may include a physical network adapter and one or more protocol stacks for sending instructions to and receiving responses, feedback, and/or sensor input from the spray head 110 and/or conveyor 130 using computer networking protocols. In one embodiment, the network interface 108 may include a wireless networking interface that connects the process controller 101 to the spray head 110 and/or conveyor 130 over radio or other wireless communication mediums. In another embodiment, the network interface 108 may include a wired or fiber optic interface for connecting the process controller 101 to the spray head 110 and/or conveyor 130.

The spray head 110, in one embodiment, is configured to selectively deliver a processing substance 114 onto the semiconductor substrate 120 as the conveyor 130 moves the semiconductor substrate 120 past the spray head 110. The spray head 110 includes at least one spray column, where each spray column includes a plurality spray nozzles 112. Each spray nozzle 112 is configured to deliver a processing substance 114 onto the semiconductor substrate 120 during a process for semiconductor manufacturing. In certain embodiments, each spray nozzle 112 is configured to deliver the processing substance 114 to a specific area below the spray head 110.

In some embodiments, the plurality of spray nozzles 112 of the spray head 110 are organized in a grid arrangement, the grid arrangement including two or more columns of spray nozzles 112 (e.g., spray columns) and a plurality of rows of spray nozzles 112, as discussed below with reference to FIGS. 6A and 6D. In some embodiments, the spray head 110 contains the process controller 101. In other embodiments, the spray head 110 is communicatively coupled to the process controller 101.

The processing substance 114, in one embodiment, may be selected from a plurality of processing substances 114 used in a process for semiconductor manufacturing. For example, the plurality of processing substances 114 may include an etching substance, a masking substance, a deposit substance (e.g., for depositing copper or other conductive material), a curing substance, a rinse material, a cleaning/preparatory substance, a vacuum, or other suitable material for processing a semiconductor substrate 120. As another example, the plurality of processing substances 114 may include different concentrations of the same type of processing substance (e.g., different concentrations of an etching substance).

In some embodiments, a spray nozzle 112 may be configured to only apply one of the plurality of processing substances 114. In other embodiments, the spray nozzle 112 may be configured to apply to a more of the plurality processing substances 114. Accordingly, in some embodiments, a spray nozzle 112 may be connected to one or more valves, each valve associated with one of the plurality of processing substances 114. The spray nozzle 112 may deliver a particular processing substance 114 in response to the valve associated with the particular processing substance 114 being open.

In certain embodiments, a spray nozzle 112 may be capable of applying more than one processing substance 114 during the same pass of the semiconductor substrate 120 past the spray head 110. For example, each spray nozzle may be configured to deliver one of the plurality of processing substances 114 to the semiconductor substrate 120 for a first part of a pass of the semiconductor substrate 120 and to switch to another of the plurality of processing substances 114 for a second part of the pass. In a further embodiment, a rinse material, such as distilled water, may be used to clean the spray nozzle 112 between the first part of the pass and the second part of the pass. In other embodiments, the spray nozzle 112 is designed so that a negligible amount of a processing substance 114 remains in a spray nozzle 112 when a valve or other means is used to shut off flow of the processing substance 114.

In some embodiments, the spray head 110 includes a drain column located adjacent to each spray column. The drain column may include a plurality of drain nozzles, each of drain nozzle configured to remove the processing substance 114 from the semiconductor substrate 120. In one embodiment, the number of drain nozzles is equal to the number of spray nozzles 112. In certain embodiments, the plurality of drain nozzles actively drain the processing substance 114 from the surface of the semiconductor substrate 120. For example, a vacuum may be applied the plurality of drain nozzles such that air and/or the processing substance 114 is drawn into the drain nozzles. In other embodiments, the plurality of drain nozzles passively drain the processing substance 114 from the surface of the semiconductor substrate. For example, each of the plurality of drain nozzles use capillary action or other passive means to draw away the processing substance 114 from the surface of the semiconductor substrate 120.

In certain embodiments, the spray head 110 may be as wide as the conveyor 130, such that the fixed spray head 110 can apply processing substance 114 to any region along the width of the conveyor 130. In further embodiments, the spray head 110 may adjust to different sized semiconductor substrates 120 (e.g., different sized wafers processed at the same time or at different times) by turning off spray nozzles that are not positioned over the semiconductor substrate 120. Additionally, the system 100 may conserve processing substance 114 by turning off spray nozzles 112 when they are not positioned over the semiconductor substrate 120. For example, the system 100 controls flow of processing substances 114 without a person manually opening and closing valves on a spray head, adding or removing spray nozzles, etc.

In some embodiments, two or more spray nozzles 112 may be configured to apply the processing substance 114 to the same area of the semiconductor substrate 120, for example to increase concentration of the processing substance 114 at that area of the semiconductor substrate 120. A first spray nozzle 112 would first apply the processing substance 114 onto that area of the semiconductor substrate 120 with subsequent spray nozzles 112 delivering subsequent applications of the processing substance 114 onto the same area as the semiconductor substrate 120 passes under the subsequent spray nozzles 112. For example, the subsequent spray nozzles 112 may be in a matrix of spray nozzles 112 as depicted in FIGS. 6A and 6D. The semiconductor processing apparatus 102 may determine a number of spray nozzles 112 needed to apply a determined amount of processing substance 114 to the area of the semiconductor substrate 120.

In some embodiments, the spray head 110 includes one or more sensors (not shown) for determining location of semiconductor substrate 120 with respect to spray head 110 and/or spray nozzles 112. While depicted in FIG. 1 as including two columns of spray nozzles 112, in other embodiments, the spray head 110 may contain one column of spray nozzles 112 or more than two columns of spray nozzles 112.

The semiconductor substrate 120, in one embodiment, is a non-conductive base material upon which electronic circuitry is formed. In some embodiments, the semiconductor substrate 120 may be a wafer, panel, or other slice of substrate material. The semiconductor substrate 120 provides mechanical support for the electronic circuitry and allows for electrical connections between combatants of the electronic circuitry. The semiconductor substrate 120 comprises a semiconductor material, such as silicon, germanium, gallium arsenate ("GaAs"), indium phosphide ("InP"), or other semiconductors. In some embodiments, the semiconductor substrate 120 may include an electrical insulator material, such as a silicon oxide substrate, aluminum oxide substrate, polymer (plastic) substrate, or other electrically insulating material. The semiconductor substrate 120 may be the substrate of a semiconductor product, such as a transistor, a diode, an integrated circuit, a printed circuit board ("PCB"), a flexible printed circuit ("FPC"), or the like.

During a process of semiconductor manufacturing, the process controller 101 may send instructions to the spray head 110 (and optionally to the conveyor 130) control the application of the processing substance 114 onto the semiconductor substrate 120.

Figure 2:
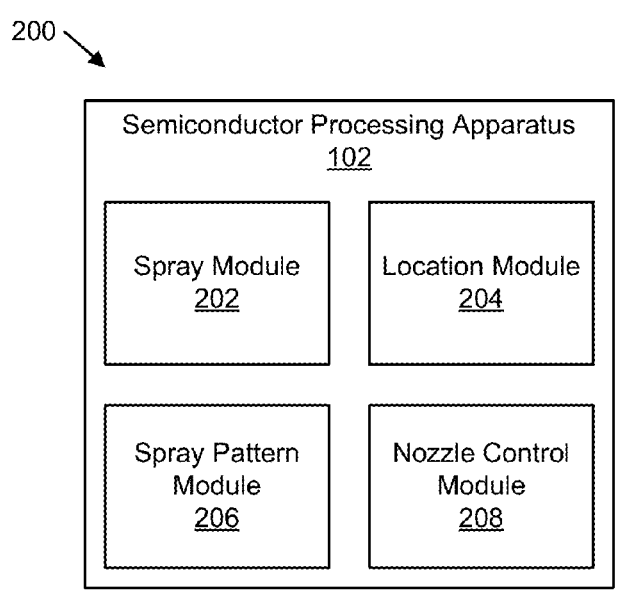
FIG. 2 is a schematic block diagram illustrating one embodiment of an apparatus for selective semiconductor processing.

FIG. 2 depicts a schematic block diagram illustrating an apparatus 200 for selective semiconductor processing, according to embodiments of the disclosure. The apparatus 200 includes a semiconductor processing apparatus 102, which may be substantially similar to the semiconductor processing apparatus 102 described above with reference to FIG. 1. In general, as described above, the apparatus 200 identifies a location of the semiconductor substrate 120 with respect to the spray head 110, determines a spray pattern of where a processing substance 114 is to be delivered to the semiconductor substrate 120, and actuates each spray nozzle 112 independently based on the spray pattern, wherein one spray nozzle 112 positioned over the semiconductor substrate 120 may be delivering a processing substance 114 while an adjacent spray nozzle 112 positioned over the semiconductor substrate 120 may be off or may be delivering a different processing substance 114.

The semiconductor processing apparatus 102, in one embodiment, includes a spray module 202, a location module 204, a spray pattern module 206, and a nozzle control module 208. The modules 202-208 of the semiconductor processing apparatus 102 may be communicatively coupled to one another.

The spray module 202, in one embodiment, includes at least one column of spray nozzles 112. Each spray nozzle 112 may be configured to deliver a processing substance 114 onto a semiconductor substrate 120 during a processor semiconductor manufacturing at the semiconductor substrate 120 moves past the spray module 202. The at least one column of spray nozzles 112 may be arranged with respect to the direction of travel of the semiconductor substrate 120 so the semiconductor substrate 120 passes the spray nozzles 112.

In some embodiments, the spray module 202 may include a two or more columns of spray nozzles 112, where each column of spray nozzles 112 is capable of delivering the processing substance 114 independently of other columns of spray nozzles 112. For example the spray nozzle 102 of one column of spray nozzles 112 may be delivering a processing substance 114 while an adjacent spray nozzle 112 in an adjacent column of spray nozzles 112 may be off. In one embodiment, one column of spray nozzles 112 may be configured to deliver the processing substance 114 while another column of spray nozzles 112 is configured to deliver a vacuum to the semiconductor substrate 120. In certain embodiments, the spray module 202 includes a grid of spray nozzles 112. The grid of spray nozzles 112 includes two or more columns of spray nozzles 112 and two or more rows of spray nozzles 112.

In some embodiments, the spray module 202 may be configured to deliver a plurality of processing substances 114 to the semiconductor substrate 120. As discussed above, each spray nozzle 112 may be configured to deliver one of the plurality of processing substances 114 onto the semiconductor substrate 120. In one embodiment, each column of spray nozzles 112 may be configured to deliver a different processing substance 114 from the plurality of processing substances 114 onto the semiconductor substrate 120. In certain embodiments, each spray nozzle 112 may be configured deliver one of the plurality of processing substances 114 for a first part of a passive the semiconductor substrate 120 and then to switch to another of the plurality of processing substances 114 for a second part of the pass.

The location module 204, in one embodiment, is configured to identify a location of the semiconductor substrate 120 with respect to the spray module 202, the spray module 202 delivering a processing substance 114 to the semiconductor substrate 120. In some embodiments, identifying the location of the semiconductor substrate 120 with respect to the spray module 202 includes determining a distance between a portion of the semiconductor substrate 120 and a column of spray nozzles 124.

In some embodiments, the location module 204 is configured to determine whether a particular spray nozzle 112 is positioned over the semiconductor substrate 120. Further the location module 204 may identify a specific portion of the semiconductor substrate 120 over which the spray nozzle 112 is positioned. In certain embodiments, the location module 204 may identify locations of one or more dies on the semiconductor substrate 120. For example, the location module 204 may load a map of die location on the semiconductor substrate 120, wherein the location module 204 identifies the position of a die with respect to the spray module 202.

The spray pattern module 206, in one embodiment, is configured to determine a spray pattern of where a processing substance 114 is to be delivered to the semiconductor substrate 120. In some embodiments, the spray pattern module 206 determines, for each location on the semiconductor substrate 120, whether the processing substance 114 is to be applied. In further embodiments, the spray pattern may indicate a type of processing substance 114 and an amount of processing substance 114 to be delivered at each location on the semiconductor substrate 120.

In some embodiments, the spray pattern module 206 determines the spray pattern by receiving an image of a layer of semiconductor substrate 120 to be processed/manufactured and identifying, from the image, areas of the semiconductor substrate 120 needing a processing substance 114 during semiconductor processing/manufacturing. In one embodiment, the spray pattern module 206 receives a two-dimensional ("2-D") vector image describing a layer of the circuitry to be manufactured on the semiconductor substrate 120. The 2-D vector image may be a format conforming to industry standards, such as Gerber format data. In a further embodiment, the spray pattern module 206 may receive an image for each layer of the circuitry to be manufactured and create a spray pattern for each layer.

In certain embodiments, the spray pattern module 206 may receive additional input data, such as inspection data, manufacturing data, and/or historical data, wherein the spray pattern is generated based on the additional input data. For example, the spray pattern module 206 may receive inspection results of a semiconductor manufactured using a spray pattern and then adjust the spray pattern based on the inspection data. In further embodiments, the spray pattern module 206 may adjust one or more spray patterns based on additional feedback (e.g., manufacturing data and/or historical data).

Based on the image data (and on additional input data), the spray pattern module 206 may determine areas of the semiconductor substrate 120 (e.g., a wafer or panel) that entail differential processing. For example, the spray pattern module 206 may determine areas where no processing (e.g., no conductive layer or oxide layer) is required, areas where a heavy amount of processing (e.g., a thick conductive layer or oxide layer) is required, and/or areas where a moderate amount of processing is required. The spray pattern module 206 may then create a spray pattern based on the determined areas requiring differential processing, where the spray pattern indicates a type and amount of processing substance 114 to be delivered to the semiconductor substrate 120. In certain embodiments, the spray pattern module 206 may create a spray pattern specific to the top and bottom sides of the semiconductor substrate 120.

The spray pattern module 206, in one embodiment, divides the surface of the semiconductor substrate 120 into a plurality of sectors, where each sector is associated with a desired level of processing (e.g., minimum processing, normal processing, or maximum processing). In some embodiments, the sector size is selected to correspond to a delivery area of a spray nozzle 112. For example, if the spray module 202 contains a column of twenty (20) spray nozzles 112, then the spray pattern module 206 may section the semiconductor substrate 120 into twenty (20) sectors, each sector corresponding to a spray nozzle 112. In another example, the spray pattern module 206 may section the semiconductor substrate 120 into a grid containing twenty (20) rows, each row in the grid corresponding to a spray nozzle 112. By sectioning the semiconductor substrate 120 based on the delivery area of a spray nozzle 112, the spray pattern module 206 may optimize the spray pattern for the amount of spray nozzles 112 in the spray module 202.

The nozzle control module 208, in one embodiment, is configured to selectively activate (e.g., turn on and off) each spray nozzle 112 based on the spray pattern. The nozzle control module 208 controls each spray nozzle 112 independently of the other spray nozzles 112, where one spray nozzle 112 of the column of spray nozzles position over the semiconductor substrate may be delivering a processing substance 114 while an adjacent spray nozzle 112 of the column the spray nozzles 112 positioned over the semiconductor substrate 120 may be off. In some embodiments, the nozzle control module 208 actuates each spray nozzle 112 independently as a semiconductor substrate 120 (e.g., a wafer) passes underneath, in response to a particular location on the semiconductor substrate 120 identified by the location module 204 being beneath the spray module 202.

In some embodiments, the nozzle control module 208 calculates a spray time based on the identified location of the semiconductor substrate 120 with respect to the spray module 202 and the spray pattern. As used herein, a spray time refers to a point in time at which spray nozzle 112 begins delivering the processing substance 114 to the semiconductor substrate 120. Calculating the spray time may include determining a distance between the identified location and a spray nozzle 112. Based on the distance and a rate of travel of the semiconductor substrate 120, the nozzle control module 208 may calculate a time for turning on the spray nozzle so as to deliver the processing substance 114 according to the spray pattern. In response to an actual time matching the calculated spray time, the nozzle control module 208 activates each spray nozzle 112. The nozzle control module 208 may calculate a spray time for each spray nozzle 112 and each location identified by the location module 204.

In some embodiments, one or more spray nozzles 112 may be configured to deliver a plurality of processing substances 114, where the nozzle control module 208 selects a particular processing substance 114 for delivery to the semiconductor substrate 120. For example, a spray nozzle 112 may be capable of delivering an etching substance, a resist substance (e.g., a photoresist), and a resist removal substance and the spray pattern may indicate that a photoresist is to be applied to the location. Accordingly, the nozzle control module 208 may control the spray nozzle 112 (e.g., via one or more valves in the spray nozzle 112) to deliver the resist substance to the semiconductor substrate based on the spray pattern. For example, the nozzle control module 208 may control a spray nozzle 112 to deliver an etching substance for a portion of a pass of a semiconductor substrate 120 (e.g., a wafer) under the spray nozzle 112 and a resist substance for another portion of the pass of the semiconductor substrate 120 under the spray nozzle 112.

In some embodiments, the spray pattern module 206 determines a type of processing substance 114 to be delivered to the semiconductor substrate 120, where the nozzle control module 208 adjusts one or more spray nozzles 112 based on a determined type of processing substance 114. The type of processing substance may be a class of processing substance 114 (e.g., etch, resist, rinse), a concentration of processing substance 114 (e.g., a high concentration or low concentration), or the like. In one embodiment, the nozzle control module 208 receives information from the spray pattern module 206 indicating the type of processing substance 114 to be delivered to the semiconductor substrate 120, where the nozzle control module 208 adjusts the spray nozzle 112 to select the indicated processing substance 114.

In certain embodiments, the nozzle control module 208 adjusts one or more spray nozzles 112 based on an amount of processing substance 114 to be delivered to the semiconductor substrate 120. For example, the spray pattern may indicate that higher amounts of the processing substance 114 are to be delivered to a particular region of the semiconductor substrate 120 that amounts to be delivered to other regions of the semiconductor substrate 120. As another example, the spray pattern may indicate that lower amounts of the processing substance 114 are to be delivered to a particular region of the semiconductor substrate 120. In one embodiment, the nozzle control module 208 turns one or more spray nozzles 112 on and off based on the amount of processing substance 114 to be delivered to the semiconductor substrate 120. For example, the nozzle control module 208 may modulate (e.g., pulse) a spray nozzle 112 on and off to deliver the indicated amount of processing substance 114. As another example, the nozzle control module 208 may activate one or more spray nozzles 112 for a particular spray duration to deliver the indicated amount of processing substance 114. In another embodiment, the spray nozzles 112 may include a variable valve and the nozzle control module 208 may activate the valve to various levels for controlling an amount of flow of a processing substance 114.

In certain embodiments, the spray module 202 includes a plurality of spray columns 302, where the nozzle control module 208 controls each spray nozzle 112 in a spray column 302 independently of other spray nozzles 112 in adjacent spray columns 302. For example, a spray nozzle 112 of one spray column 302 may be delivering a processing substance 114, while an adjacent spray nozzle 112 in an adjacent spray column 302 may be off. As another example, a spray nozzle 112 of one spray column 302 may deliver a first processing substance 114 (e.g., a processing chemical), while an adjacent spray nozzle 112 in an adjacent spray column 302 may be deliver a second processing substance (e.g., a rinse). In some embodiments, a single spray nozzle 112 may be unable to deliver a desired amount of processing substance 114 to the identified location on the semiconductor substrate 120 during the time that the identified location is beneath the spray nozzle 112. The nozzle control module 208 may turn on a number of adjacent spray nozzles 112 (e.g., adjacent in a direction parallel to the travel of the semiconductor substrate 120) based on desired amount of processing substance 114.

Figure 3:
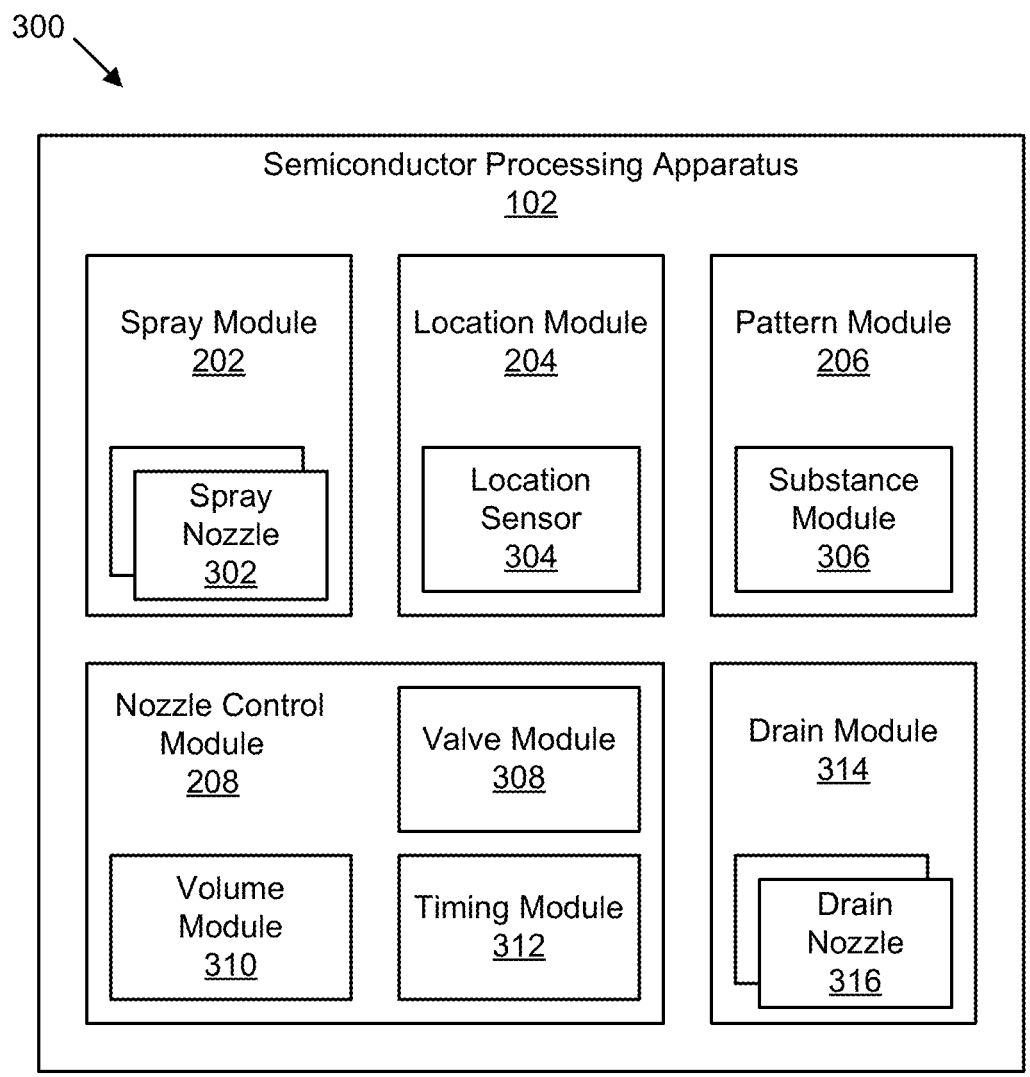
FIG. 3 is a schematic block diagram illustrating another embodiment of an apparatus for selective semiconductor processing.

FIG. 3 depicts a schematic block diagram illustrating an apparatus 300 for selective semiconductor processing, according to embodiments of the disclosure. The apparatus 300 includes a semiconductor processing apparatus 102, which may be substantially similar to the semiconductor processing apparatus 102 described above with reference to FIGS. 1 and 2. The semiconductor processing apparatus 102, in one embodiment, includes a spray module 202, a location module 204, a spray pattern module 206, and a nozzle control module 208, which may be substantially similar to those described in relation to the apparatus 200 of FIG. 2. In some embodiments, the semiconductor processing apparatus 102 may also include a plurality of spray columns 302, a location sensor 304, a substance module 306, a valve module 308, a volume module 310, a timing module 312, a drain module 314, and/or a plurality of drain columns 316.

The spray module 202 may be substantially as described above with reference to FIG. 2. In some embodiments, the spray module 202 further includes a plurality of spray columns 302, where each spray column 302 includes a plurality of spray nozzles 112 arranged with respect to a direction of travel of the semiconductor substrate 120 so the semiconductor substrate 120 passes the spray nozzles 112. In one embodiment, the spray nozzles 112 are arranged in a line substantially perpendicular to the direction of travel of the semiconductor substrate 120. Hereinafter, substantially perpendicular means that the spray nozzles 112 may be perpendicular to the direction of travel or may be angled or arranged so that as the semiconductor substrate 120 passes the spray nozzles 112, the spray nozzles 112 are capable of delivering a process substance 114 to semiconductor substrate 120. For example, the spray nozzles 112 may be in a column and the column may be perpendicular to the direction of travel of the semiconductor substrate 120 or the column of spray nozzles 112 are angled with respect to the direction of travel. In another embodiment, the spray nozzles 112 are arranged in a pattern where each portion of the semiconductor substrate 120 passes under the spray nozzles 112.

In some embodiments, the length of the spray column 302 is equal to the width of the conveyor 130, such that the spray column 302 is capable of delivering a processing substance 114 to any point along the width of the conveyor 130. Accordingly, semiconductor substrates 120 (e.g., wafers) of varying sizes may be used with the conveyor 130, where the nozzle control module 208 may selectively activate a number of spray nozzles 112 in the spray column 302 needed to cover the semiconductor substrate 120, and the number of spray nozzles 112 is based on the size of the semiconductor substrate 120.

In some embodiments, each spray column 302 may be configured to deliver one of a plurality of processing substances 114. For example, where the spray module 202 is capable of delivering four types of processing substances 114 (e.g., an etching substance, conductive substance, a resist substance, and a curing substance), the spray module 202 may include four spray columns 302, each spray column delivering a different one of the four types of processing substances 114. In certain embodiments, a spray column 302 may be configured to deliver a subset of the plurality processing substances 114, where each spray nozzle 112 in the spray column 302 may selectively deliver one of the subset of processing substances 114.

The location module 204 may be substantially as described above with reference to FIG. 2. In some embodiments, the location module 204 further includes at least one location sensor 304. The location sensor 304, in one embodiment, is configured to detect a location of the semiconductor substrate 120. Based on the detected location, the location module 204 then identify a location of the semiconductor substrate 120 with respect to the spray module 202.

In some embodiments, the location sensor 304 may include an optical sensor, such as a photodetector or an image sensor. For example, the semiconductor substrate 120 may disrupt a beam of visible light, infrared radiation, or other electromagnetic radiation as the semiconductor substrate 120 passes a particular position along the conveyor 130. As another example, a digital camera may track progress of the semiconductor substrate 120 along the conveyor 130 so as to determine the location of the semiconductor substrate 120 at any given point in time. In certain embodiments, the location sensor 304 may identify travel of the conveyor 130, where the location of the semiconductor substrate 120 with respect to the spray module 202 is determined based on the travel of the conveyor 130 (e.g., a number of rotations of a drive pulley of the conveyor 130).

In some embodiments, the location sensor 304 is configured to identify a particular location on the surface of the semiconductor substrate 120, for example the location of a particular die on a silicon wafer. Location module 204 may then determine the position of the particular location of the surface of the semiconductor substrate 120 with respect to the spray module 202. In certain embodiments, the location sensor 304 may determine whether the semiconductor substrate 120 is positioned beneath the spray module 202. In a further embodiment, the location sensor 304 may determine whether the semiconductor substrate 120 is positioned beneath a column of spray nozzles.

The spray pattern module 206 may be substantially as described above with reference to FIG. 2. In some embodiments, the spray pattern module 206 further includes a substance module 306. The substance module 306, in one embodiment, is configured to determine a type and an amount of processing substance 114 to be delivered to the location on the semiconductor substrate 120 identified by the location module 204.

As discussed above, the spray module 202 may be capable of delivering a plurality of processing substances 114 to the semiconductor substrate 120. Based on the circuitry to be manufactured on the semiconductor substrate 120, the substance module 306 may determine a type of processing substance 114 required for the identified location, for example a masking substance (e.g., a photoresist), an etching substance, a curing substance, a cleaning substance, a rinse, or the like. The substance module 306 may further determine an amount of processing substance 114, of the identified type, for achieving a desired amount of processing at the identified location.

In some embodiments, the substance module 306 identifies a concentration of the processing substance 114 required for the identified location. For example, a spray nozzle 112 may be connected to a high concentration etching solution and a low concentration etching solution, where the substance module 306 identifies whether the high concentration or low concentration etching solution is to be applied to a particular location on the semiconductor substrate 120. The substance module 306 may further determine an amount of processing substance 114, of the identified concentration, for achieving a desired amount of processing at the identified location.

In some embodiments, a single spray nozzle 112 may be unable to deliver a determined amount of processing substance 114 to the identified location on the semiconductor substrate 120 during the time that the identified location is beneath the spray nozzle 112. Accordingly, the substance module 306 may determine that additional spray nozzles 112 are needed to deliver the determined amount, where the nozzle control module 208 turns on a number of adjacent spray nozzles 112 (e.g., adjacent in a direction parallel to the travel of the semiconductor substrate 120) based on the amount of processing substance determined by the substance module 306.

The nozzle control module 208 may be substantially as described above with reference to FIG. 2. In some embodiments, the nozzle control module 208 may further include a valve module 308 for controlling one or more valves of the spray nozzles 112, a volume module 310 for monitoring an amount of processing substance delivered to the semiconductor substrate 120, and/or a timing module 312 for identifying when to turn on and off each spray nozzle 112.

The valve module 308, in one embodiment, is configured to actuate one or more valves of a spray nozzle 112, the valve connecting the spray nozzle 112 to a reservoir of processing substance 114, where actuating the one or more valves turns the spray nozzle 112 on or off. In some embodiments, a spray nozzle 112 may be configured to deliver a plurality of processing substances 114, each of the plurality of processing substances 114 being associated with a valve. When opened, the valve allows a processing substance 114 to flow from the reservoir into the spray nozzle 112, where the spray nozzle 112 delivers processing substance 114 onto a surface of the semiconductor substrate 120. Further, when closed, the valve prevents the processing substance 114 from flowing into the spray nozzle 112, thereby allowing another processing substance 114 to flow into the spray nozzle 112 or preventing of delivery of processing substance 114 from the spray nozzle 112.

In some embodiments, the valve module 308 identifies a valve for actuating based on the type of processing substance 114 determined by the spray pattern module 206 and/or the substance module 306. For example, if the spray pattern indicates that an etching substance is to be delivered to the semiconductor substrate 120, then the valve module 308 may identify and actuate (e.g., open and close) a valve for the etching substance. Thus, the valve module 308 may select a particular processing substance 114 for delivery to the semiconductor substrate 120 based on the spray pattern and/or the determined processing substance type.

The volume module 310, in one embodiment, is configured to monitor a volume (e.g., an amount) of processing substance 114 delivered by a spray nozzle 112. In some embodiments, the volume module 310 monitors rates of delivery of the processing substance 114 through each spray nozzle 112. The volume module 310 may further monitor durations of delivery of the processing substance 114 through each spray nozzle 112, where the volume module 310 may calculate the volume of delivered processing substance 114 based on the rates of delivery and the durations of delivery. In certain embodiments, the volume module 310 may signal the valve module 308 to close the valve associated with the spray nozzle 112 as the volume of delivered processing substance 114 approaches (or, alternatively, reaches) an amount of processing substance 114 as determined by the substance module 306.

The timing module 312, in one embodiment, is configured to calculate times for applying the processing substance 114. The timing module 312 may provide the calculated times to the nozzle control module 208 and/or the valve module 308, where the nozzle control module 208 and/or the valve module 308 selectively activate each spray nozzle 112 based on the calculated times. In some embodiments, the timing module 312 may calculate a spray time based on the location of the semiconductor substrate 120 with respect to the spray module 202. In one embodiment, the spray time indicates a time at which a particular region of the semiconductor substrate 120 is beneath a spray column 302, the particular region associated with a portion of the spray pattern. Accordingly, the nozzle control module 208 and/or the valve module 308 may selectively activate each spray nozzle 112 at the calculated spray time.

In some embodiments, the timing module 312 may calculate a spray duration based on an amount of processing substance 114 to be applied to the semiconductor substrate 120. For example, the timing module 312 may determine a start time (e.g., spray time) and/or stop time for applying the processing substance 114. The spray duration may be calculated based on a spray nozzle's 112 rate of delivery of the processing substance 114, the amount of processing substance 114 required at a location of the semiconductor substrate 120 below the spray nozzle 112, an opening/closing speed of the valve for the processing substance 114, and/or other relevant factors. The timing module 312 may provide the calculated spray duration to the nozzle control module 208 and/or the valve module 308, where the nozzle control module 208 and/or the valve module 308 activates the spray nozzle 112 for the calculated spray duration, after which the nozzle control module 208 and/or the valve module 308 deactivates the spray nozzle 112.

The drain module 314, in one embodiment, is configured to remove the processing substance 114 from the surface of the semiconductor substrate 120. In some embodiments, the drain module 314 removes excess processing substance 114, ensuring that the processing substance 114 is only applied to intended locations on the semiconductor substrate 120 (e.g., according to the spray pattern). The drain module 314, in certain embodiments, includes at least a drain column 316 for each spay column 302, where each drain column 316 is located adjacent to a spray column 302. Each drain column 316 may include a plurality of drain nozzles configured to remove the processing substance 114 from the semiconductor substrate 120. In one embodiment, the number of drain nozzles of a drain column 316 is equal to the number of spray nozzles 112 in the adjacent spray column 302.

In certain embodiments, a drain column 316 may actively remove the processing substance 114 from the surface of the semiconductor substrate 120. For example, a vacuum may be applied the plurality of drain nozzles such that the processing substance 114 is drawn into the drain nozzles. In some embodiments, a drain column 316 may passively drain the processing substance 114 from the surface of the semiconductor substrate. For example, each of the plurality of drain nozzles may use capillary action or other passive means to draw away the processing substance 114 from the surface of the semiconductor substrate 120. In further embodiments, the drain module 314 may be further configured to apply a rinse to the semiconductor substrate 120 before removing the processing substance 114 from the surface of the semiconductor substrate 120.

Figure 4:
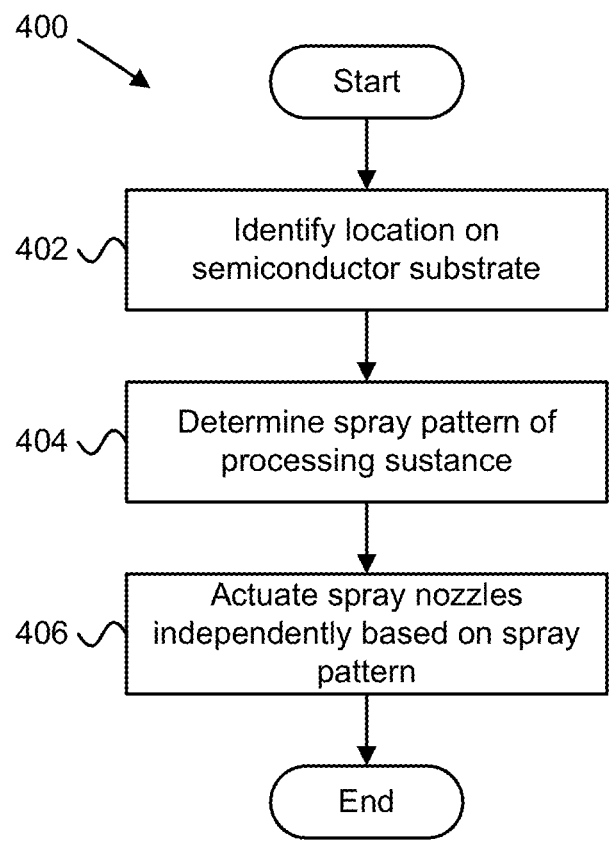
FIG. 4 is a schematic flow chart diagram illustrating one embodiment of a method for selective semiconductor processing.

FIG. 4 depicts a schematic flow chart diagram illustrating a method 400 for selective semiconductor processing, according to embodiments of the disclosure. In some embodiments, the method 400 is performed by a controller, such as the process controller 101 described above with reference to FIG. 1. In other embodiments, the method 400 may be performed by a processing apparatus, such as the semiconductor processing apparatus 102, the apparatus 200, or the apparatus 300 described above with reference to FIGS. 1-3. In certain embodiments, the method 400 may be performed by a processor executing program code, for example, a microcontroller, a microprocessor, a central processing unit ("CPU"), a graphics processing unit ("GPU"), an auxiliary processing unit, a FPGA, or the like.

The method 400 begins and identifies 402 the location of a semiconductor substrate 120 with respect to a spray module 202. For example, the location module 204 may identify 402 a particular location on the semiconductor substrate 120 with respect to the spray module 202. In some embodiments, the spray module 202 includes at least one column of spray nozzles 112, where each spray nozzle 112 is configured to deliver a processing substance 114 on the semiconductor substrate 120 during a process for semiconductor manufacturing as the semiconductor substrate 120 passes the spray module 202. In one embodiment, the column of spray nozzles 112 is arranged with respect to the direction of travel of the semiconductor substrate 120 so the semiconductor substrate 120 passes the spray nozzles 112.

The method determines 404 a spray pattern of where the processing substance 114 is to be applied to the semiconductor substrate 120. For example, the spray pattern module 206 may determine 404 the spray pattern. In some embodiments, the spray pattern indicates a type of processing substance 114 and an amount of the processing substance 114 to be applied to the semiconductor substrate 120 at the identified location. In certain embodiments, the spray pattern module 206 determines 404 the spray pattern based on an image of a layer of electronic circuitry to be manufactured on the semiconductor substrate 120.

The method actuates 406 each spray nozzle 112 independently based on the spray pattern, where each spray nozzle 112 is independently activated, and the method 400 ends. For example, the nozzle control module 208 may selectively activate 406 each spray nozzle based on the spray pattern. In some embodiments, one spray nozzle 112 of a column of spray nozzles 112 positioned over the semiconductor substrate 120 may deliver a processing substance 114 while an adjacent spray nozzle 112 of the column of spray nozzles 112 positioned over the semiconductor substrate 120 may be off, so as to allow differential processing of the semiconductor substrate 120. In certain embodiments, one spray nozzle 112 of the column of spray nozzles 112 positioned over the semiconductor substrate 120 may deliver a processing substance 114 while an adjacent spray nozzle 112 not positioned over the semiconductor substrate 120 may be off, so as to minimize consumption of the processing substance 114.

Figure 5:
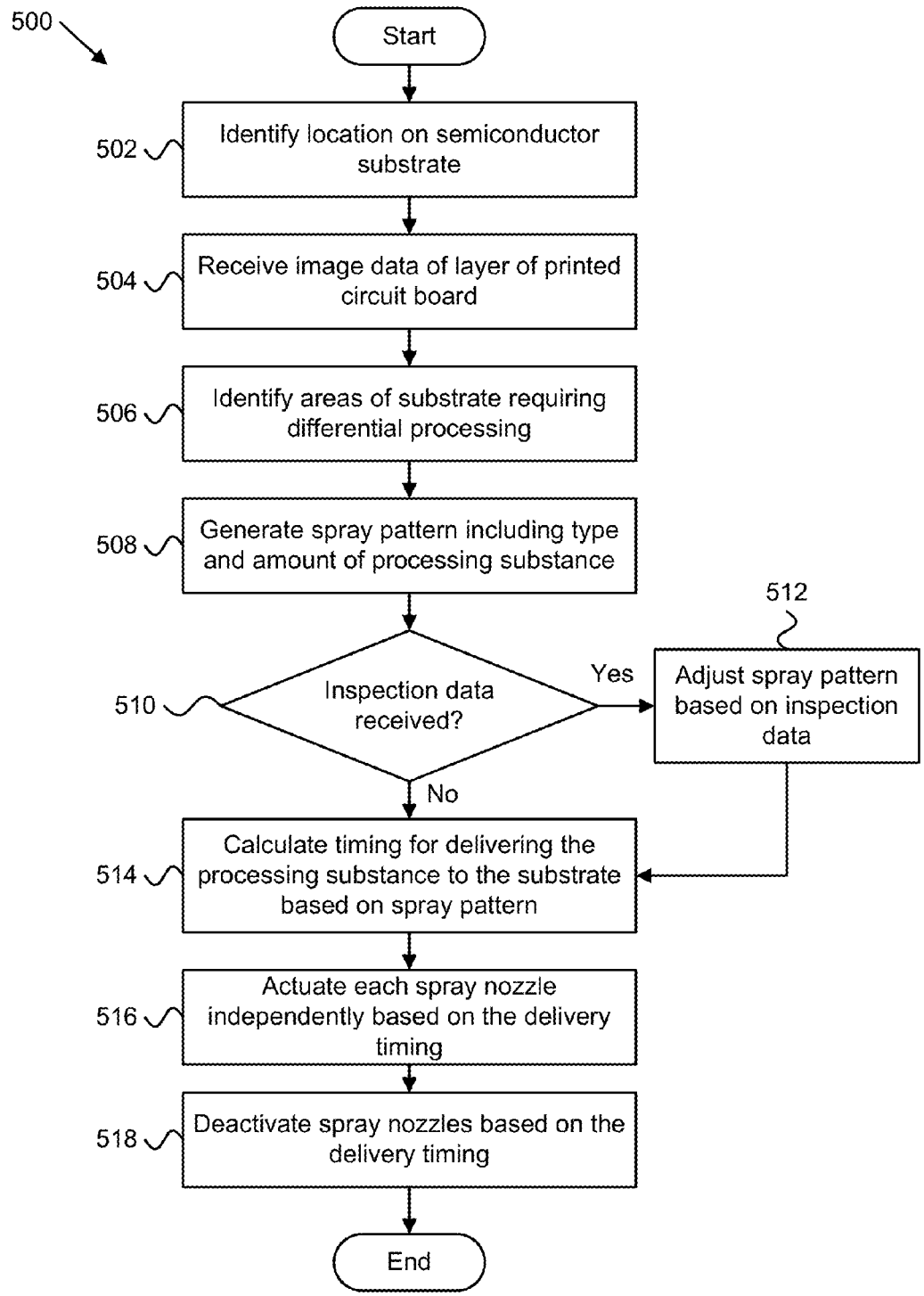
FIG. 5 is a schematic flow chart diagram illustrating another embodiment of a method for selective semiconductor processing.

FIG. 5 depicts a schematic flow chart diagram illustrating a method 500 for selective semiconductor processing, according to embodiments of the disclosure. In some embodiments, the method 500 is performed by a controller, such as the process controller 101 described above with reference to FIG. 1. In other embodiments, the method 500 may be performed by a processing apparatus, such as the semiconductor processing apparatus 102, the apparatus 200, or the apparatus 300 described above with reference to FIGS. 1-3. In certain embodiments, the method 500 may be performed by a processor executing program code, for example, a microcontroller, a microprocessor, a central processing unit ("CPU"), a graphics processing unit ("GPU"), an auxiliary processing unit, a field-programmable gate array ("FPGA"), or the like.

The method 500 begins, and identifies 502 a location on a semiconductor substrate 120 with respect to a spray module 202, the spray module 202 including at least one spray column 302 of spray nozzles 112. For example, the location module 204 may identify 502 a location on the semiconductor substrate 120. In one embodiment, identifying 502 the location on the semiconductor substrate 120 with respect to the spray module 202 includes determining whether the semiconductor substrate 120 is positioned beneath a spray nozzle 112 of the spray module 202.

The method receives 504 image data of a layer of a semiconductor product, such as a printed circuit board, integrated circuit, etc. to be manufactured on the semiconductor substrate 120. For example, the spray pattern module 206 may receive 504 the image data. In some embodiments, receiving 504 the image data includes receiving image data in an industry standard format, such as Gerber format data. In certain embodiments, receiving 504 the image data includes downloading the image data, for example from a server storing the image data or from removable storage media.

The method identifies 506 areas of the semiconductor substrate 120 requiring differential processing based on the image data. For example, the spray pattern module 206 may identify 506 areas of a wafer requiring differential processing. In some embodiments, the spray pattern module 206 identifies 506 areas were no processing (e.g., no conductive layer or oxide layer) is desired, areas where a heavy amount of processing (e.g., a thick conductive layer or oxide layer) is desired, and/or areas where a normal amount of processing is desired.

The method generates 508 a spray pattern based on the determined areas requiring differential processing, the spray pattern indicating a type and amount of processing substance 114 to be delivered to the semiconductor substrate 120. For example, the spray pattern module 206 may generate 508 the spray pattern based on the areas requiring differential processing. In certain embodiments, generating 508 the spray pattern includes dividing the surface of the semiconductor substrate 120 into a plurality of sectors, where each sector is associated with a desired level of processing (e.g., minimum processing, normal processing, or maximum processing). The sector size may be selected to correspond to a delivery area of a spray nozzle 112.

The method determines 510 whether inspection data is received. For example, the spray pattern module 206 may determine 510 whether inspection data has been received. The inspection data includes inspection results of a semiconductor product, such as a printed circuit board, integrated circuit, etc. manufactured using the generated spray pattern. In response to the receiving the inspection data, the method adjusts 512 the spray pattern based on the receive inspection data. For example, the spray pattern module 206 may adjust 512 the spray pattern. Otherwise, the method calculates 514 timing for delivering the processing substance 114 to the semiconductor substrate 120 based on the generated spray pattern. For example, the nozzle control module 208 may calculate 514 timing for delivering the processing substance 114.

Calculating 514 the delivery timing, in one embodiment, includes calculating a time at which the identified location is beneath a spray nozzle 112. In some embodiments, calculating 514 the delivery timing includes calculating a start time and a stop time or a spray duration for applying the processing substance 114. The delivery timing may be calculated based on a spray nozzle's 112 rate of delivery of the processing substance 114, the amount of processing substance 114 required, and the like.

The method actuates 516 each spray nozzle 112 independently based on the delivery timing. For example, the nozzle control module 208 may selectively activate 516 each spray nozzle 112. The nozzle control module 208 also deactivates 518 each spray nozzle 112 based on the delivery timing, and the method 500 ends. In some embodiments, the nozzle control module 208 activates and/or deactivates 516 each spray nozzle 112 independently of other spray nozzles 112, where one spray nozzle 112 may be delivering the processing substance 114 while an adjacent spray nozzle 112 may be turned off, according to the delivery timing.

Figure 6A:
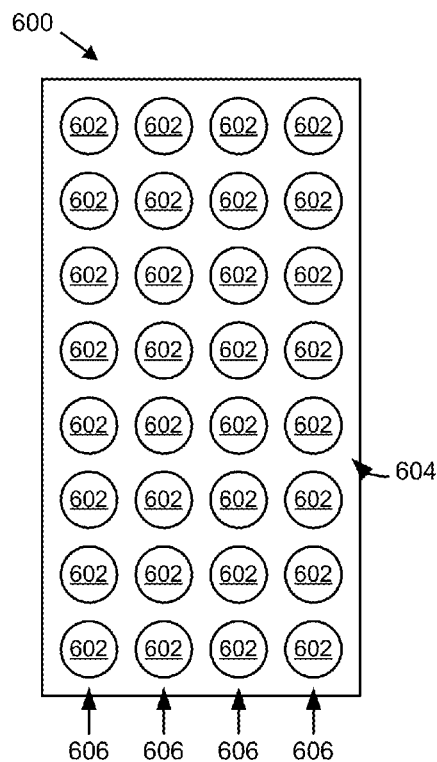
FIG. 6A depicts one embodiment of a process head.

FIG. 6A depicts a process head 600, according to embodiments of the disclosure. In some embodiments, the process head 600 may be substantially similar to the spray head 110 and/or the spray module 202 described above with reference to FIGS. 1 and 2. The process head 600 includes a plurality of delivery nozzles 602, the plurality of delivery nozzle 602 arranged into a plurality of delivery columns 606. The delivery nozzles 602 are supported by a support 604. In some embodiments, the delivery nozzles 602 are substantially similar to the spray nozzles 112 described above with reference to FIG. 1.

In some embodiments, the size of each delivery column 606 is configured such that the delivery nozzles 602 of the delivery column 606 can reach each part of a conveyor system, such as a conveyor belt, used to transport a semiconductor substrate past the process head 600. Each delivery nozzle 602 may be independently controlled, such that one delivery nozzle 602 may be delivering a processing substance 114 while an adjacent delivery nozzle 602 may be turned off. While FIG. 6A shows for delivery columns 606, in other embodiments, the process head 600 may include any number of delivery columns 606. Further, while FIG. 6A shows each delivery column 606 including eight (8) delivery nozzles 602, in other embodiments, a spray column may contain more or less delivery nozzles 602. For example, the number of delivery nozzles 602 in a delivery column 606 may be sufficient to stretch from one edge of a conveyor belt to the other edge.

Figure 6B:
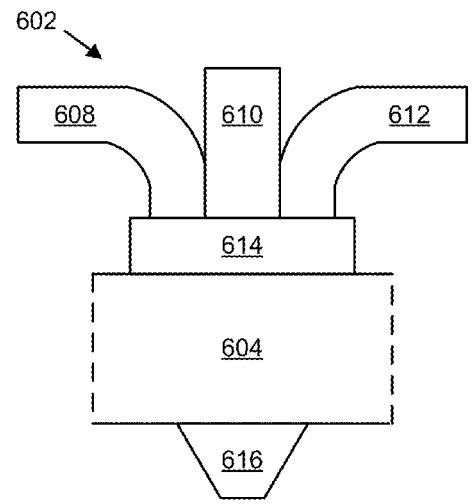
FIG. 6B depicts one embodiment of a delivery nozzle.

FIG. 6B depicts a delivery nozzle 602. The delivery nozzle 602 includes a first feed 608, a second feed 610, a third feed 612, a valve 614, and an aperture 616. As discussed above, the delivery nozzle 602 may be held in the process head 600 via a support 604. Each feed 608-612 corresponds to a different processing substance 114. Thus, the first feed 608 connects the delivery nozzle 602 to a first reservoir containing a first processing substance, the second feed 610 connects the delivery nozzle 602 to a second reservoir containing a second processing substance, and the third feed 612 connects delivery nozzle 602 to a third reservoir containing a third processing substance. The valve 614 controls which processing substance (e.g., of the plurality processing substances) is delivered to a semiconductor substrate via the aperture 616.

The valve 614 may be controlled electronically via controller, for example via the nozzle control module 208. While depicted as a single valve, in some embodiments the valve 614 contains electronically controlled valves, such that each feed 608-612 is controlled independently via a valve. In some embodiments, the valve 614 may permit two or more processing substances to be delivered via the aperture 616 at the same time. For example, the first feed 608 may contain a high concentrate etching substance, while the second feed 610 may contain distilled water. In response to a spray pattern indicating that a mild etching substance is to be delivered, the valve 614 may deliver both the high concentrate etching substance and the distilled water, such that a diluted etching substance is delivered to the semiconductor substrate via the aperture 616. In further embodiments, the aperture 616 may include a mixing chamber for mixing two or more processing substances 114. In one embodiment, the valve 614 may be positioned close to the aperture 616 so that a negligible amount of processing substance 114 is left in the delivery nozzle 602 beyond the valve 614 after the valve 614 is turned off, or so that the remaining amount of processing substance 114 may be quickly removed.

Figure 6C:
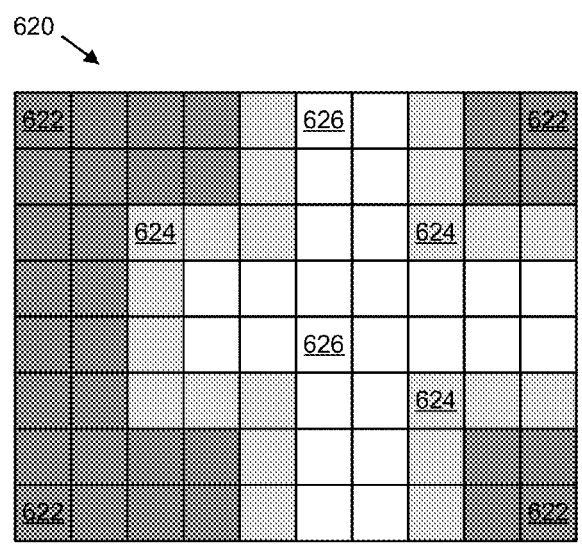
FIG. 6C depicts one embodiment of a spray pattern.

FIG. 6C depicts a spray pattern 620. In some embodiments, the spray pattern 620 is generated by a spray pattern module 206. The spray pattern 620 indicates where a processing substance 114 is to be delivered onto a substrate, such as the semiconductor substrate 120. As described above, the spray pattern module 206 may receive image data of a layer of a semiconductor product, such as a printed circuit board, integrated circuit, or the like, where the spray pattern module 206 identifies areas of the semiconductor substrate requiring different levels of processing. As illustrated, the spray pattern 620 includes a plurality of high processing regions 622, a plurality of medium processing regions 624, and a plurality of low processing regions 626. In another embodiment, the spray pattern 620 includes a plurality of processing substances 114, so that one color 622 may represent a first processing substance 114, a second color 624 may represent a second processing substance 114, and a third color 626 may represent a third processing substance 114. In other embodiments, any of the colors 622, 624, 626 may also represent a vacuum or other process.

Figure 6D:
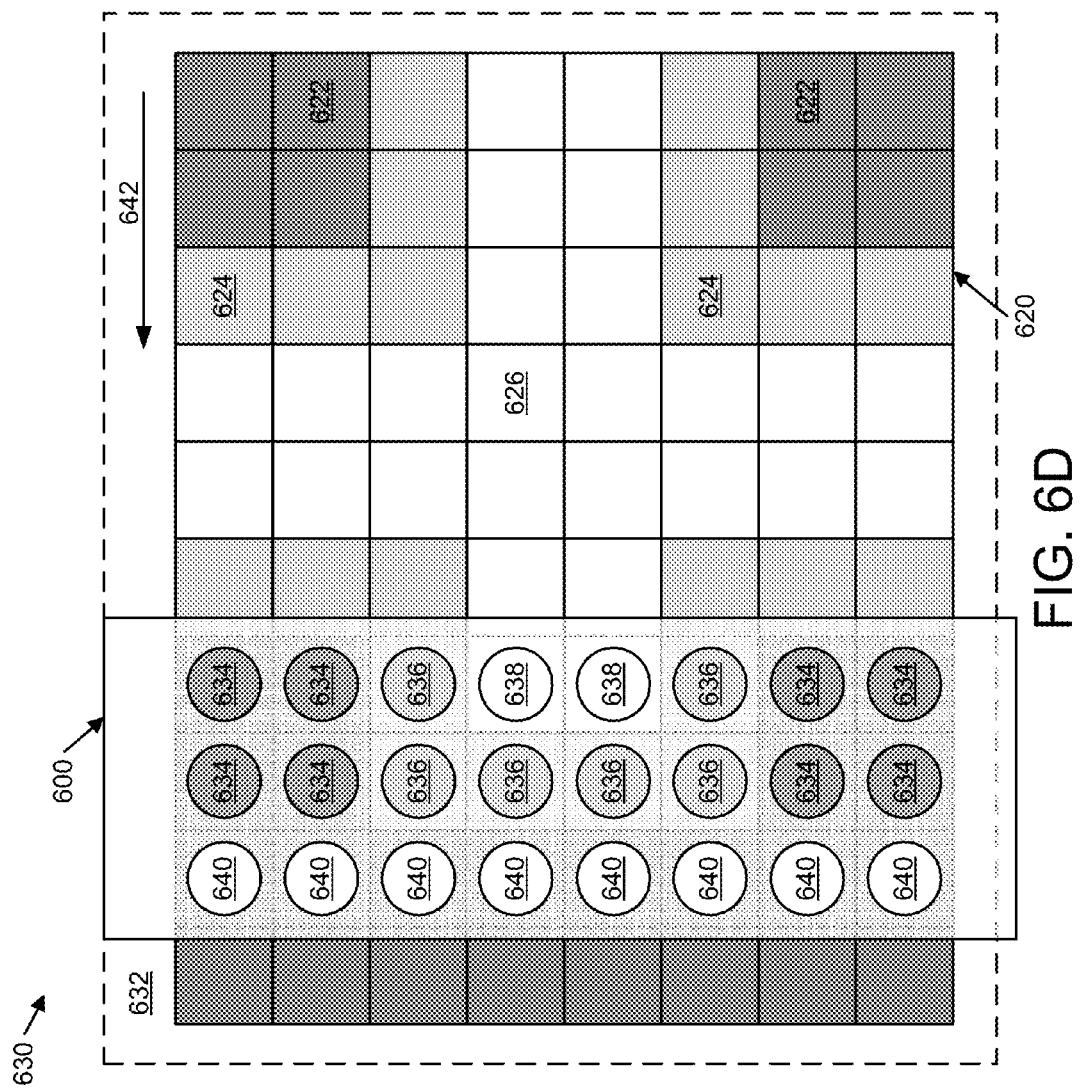
FIG. 6D depicts one embodiment of a system for selective semiconductor processing, including the process head of FIG. 6A delivering processing substance using the spray pattern.

FIG. 6D depicts a system 630 for selective semiconductor processing, including the process head 600 delivering processing substance using the spray pattern 620. The system 630 includes a process head 600 positioned above a semiconductor substrate 632 traveling in a direction indicated by the arrow 642. The process head 600 may be controlled, for example, by a process controller 101, a semiconductor processing apparatus 102, and/or a nozzle control module 208, so as to deliver processing substance to the semiconductor substrate 632 based on the spray pattern 620. FIG. 6D shows the spray pattern 620 atop the semiconductor substrate 632 for illustration purposes; however, the spray pattern 620 is received as data indicating where each spray nozzle of the process head 600 is to deliver processing substance to the semiconductor substrate 632.

As depicted, one or more high concentration spray nozzles 634 may be turned on responsive to areas of the semiconductor substrate 632 corresponding to high processing regions 622 of the spray pattern 620 reaching the process head 600. The high concentration spray nozzles 634 configured to deliver high concentrations of processing substance, for example by opening the valve 614 to a feed of high concentration processing substance 144. Further, as the areas of the semiconductor substrate 632 requiring high processing move past the high concentration spray nozzles 634, said high concentration spray nozzles 634 may remain on or be turned off, according to the spray pattern 620.

Also as depicted, one or more medium concentration spray nozzles 636 may be turned on in response to areas of the semiconductor substrate 632 corresponding to medium processing regions 624 of the spray pattern 620 reaching the process head 600. The medium concentration spray nozzles 636 are configured to deliver medium concentrations of a processing substance. In some embodiments, a delivery nozzle 602 may be adjusted (e.g., by adjusting the valve 614) such that a high concentration spray nozzle 634 becomes a medium concentration spray nozzle 636 (e.g., one delivering a medium concentration processing substance). One or more high concentration spray nozzles 634 may be adjusted to become medium concentration spray nozzles 636 according to the spray pattern 620. Further, as the areas of the semiconductor substrate 632 requiring medium processing move past the medium concentration spray nozzles 636, said medium concentration spray nozzle 636 may remain on or be turned off, according to the spray pattern 620.

As further depicted, when areas of the semiconductor substrate 632 corresponding to low processing regions 626 of the spray pattern 620 reach the process head 600, one or more low concentration spray nozzles 638 may be turned on. Alternatively, when the areas of the semiconductor substrate 632 corresponding to low processing regions 626 of the spray pattern 620 reach the process head 600, one or more delivery nozzles 602 directly above said areas may be turned off.

The process head 600 may further include one or more rinse/drain nozzles 640. The rinse/drain nozzles 640 may be configured to rinse and/or drain a processing substance 114 off of the surface of the semiconductor substrate 632. In certain embodiments, the rinse/drain nozzles 640 may be configured to deliver a vacuum to the surface of the semiconductor substrate 632, such that processing substance 114 is removed from the surface of the semiconductor substrate 632.

While FIG. 6D depicts the process head 600 as containing three delivery columns 606 of delivery nozzles 602, in other embodiments the process head 600 may include more than three delivery columns 606 of delivery nozzles 602. For example, the process head 600 may alternate between columns 606 of delivery nozzle 602 delivering processing substance 114, and columns 606 of delivery nozzles 602 delivering vacuum, drain, and/or rinse. In other embodiments, each of the nozzles 636, 638, 640 of the process head 600 may deliver multiple processing substances 114, a vacuum, etc. and inclusion of multiple delivery columns 606 may allow for variation of flow time of a processing substance 114, variation of vacuum time, etc.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a spray module comprising at least one column of spray nozzles, each spray nozzle comprising an aperture coupled to a plurality of feeds, each of the plurality of feeds supplying a different one of a plurality of processing substances to the aperture of the spray nozzle, each spray nozzle to deliver a processing substance of the plurality of processing substances through the aperture on a semiconductor substrate during a process for semiconductor manufacturing as the semiconductor substrate moves past the spray module, wherein the at least one column of spray nozzles is arranged with respect to a direction of travel of the semiconductor substrate so the semiconductor substrate passes the spray nozzles;
    a location module that identifies a location of the semiconductor substrate with respect to the spray module;
    a spray pattern module that determines a spray pattern of where the processing substance is to be delivered to the semiconductor substrate; and
    a nozzle control module configured to actuate each spray nozzle independently based on the spray pattern and a location of the semiconductor identified by the location module and configured to select the processing substance to be delivered to the semiconductor substrate by activating a feed of the plurality of feeds.

2. The apparatus of claim 1, wherein the nozzle control module selectively turns on and off each spray nozzle in response to the location of the semiconductor substrate passing under the spray module.

3. The apparatus of claim 1, wherein the spray module is to deliver multiple processing substances of the plurality of processing substances to the semiconductor substrate, each processing substance having a processing substance type and the spray pattern module further comprising a substance module that determines a type and amount of processing substance to be delivered to a particular location on the semiconductor substrate.

4. The apparatus of claim 3, wherein each spray nozzle is to deliver one of the plurality of processing substances to the semiconductor substrate, wherein the nozzle control module adjusts a spray nozzle based on the determined processing substance type and turns the spray nozzle on and off based on the amount of processing substance to be delivered to the semiconductor substrate.

5. The apparatus of claim 3, wherein each spray nozzle is to deliver one of the plurality of processing substances for a first part of a pass of the semiconductor substrate and to switch to another of the plurality of processing substances for a second part of the pass.

6. The apparatus of claim 3, wherein the plurality of processing substances comprises an etching substance, a masking substance, a deposit substance, a curing substance, a rinse, a cleaner, and a vacuum.

7. The apparatus of claim 1, wherein the spray module comprises a plurality of columns of spray nozzles, wherein the nozzle control module controls each spray nozzle in a column of spray nozzles independently, wherein a spray nozzle of one column of spray nozzles is capable of simultaneously delivering a combination processing substances to the semiconductor substrate by activating a combination of the plurality of feeds coupled to the single aperture of the spray nozzle.

8. The apparatus of claim 7, wherein one column of spray nozzles is to spray the processing substance and another column of spray nozzles is configured to deliver a vacuum to the semiconductor substrate.

9. The apparatus of claim 7, wherein each column of spray nozzles is to spray a different processing substance from the plurality of processing substance types onto the semiconductor substrate.

10. The apparatus of claim 7, further comprising a substance module that determines an amount of processing substance to be applied to the semiconductor substrate at a particular location on the semiconductor substrate, wherein the nozzle control module turns on an amount of columns of spray nozzles to deliver the determined amount of processing substance to the particular location.

11. The apparatus of claim 1, wherein the nozzle control module controls each spray nozzle independently such that one spray nozzle of the column of spray nozzles positioned over the semiconductor substrate is capable of delivering the processing substance while an adjacent spray nozzle of the column of spray nozzles positioned over the semiconductor substrate is one of:

off; and delivering a different process substance.

\* \* \* \* \*